United States Patent
Ono et al.

(10) Patent No.: US 6,822,984 B2
(45) Date of Patent: Nov. 23, 2004

(54) DEVICE FOR AND METHOD OF TESTING SEMICONDUCTOR LASER MODULE

(75) Inventors: Haruyoshi Ono, Yamanashi (JP); Isao Baba, Yamanashi (JP)

(73) Assignee: Fujitsu Quantum Devices Limited, Yamanashi (JP)

(*) Notice: Subject to any disclaimer, the term of this patent is extended or adjusted under 35 U.S.C. 154(b) by 52 days.

(21) Appl. No.: 10/143,945

(22) Filed: May 14, 2002

(65) Prior Publication Data

US 2002/0172243 A1 Nov. 21, 2002

(30) Foreign Application Priority Data

May 21, 2001 (JP) ........................................ 2001-150384

(51) Int. Cl.[7] .................................................. H01S 3/13
(52) U.S. Cl. ..................................... 372/29.02; 372/16
(58) Field of Search ....................... 372/18–34, 38.01, 372/29.01–29.46

(56) References Cited

U.S. PATENT DOCUMENTS

| | | | | |
|---|---|---|---|---|
| 5,299,212 A | * | 3/1994 | Koch et al. ................... | 372/32 |
| 5,602,860 A | * | 2/1997 | Masonson .................... | 372/34 |
| 5,706,301 A | * | 1/1998 | Lagerstrom .................. | 372/32 |
| 5,717,712 A | * | 2/1998 | Swaminathan et al. ..... | 372/107 |
| 5,740,191 A | * | 4/1998 | Kasper et al. ................ | 372/34 |
| 5,818,857 A | * | 10/1998 | Palmer ......................... | 372/32 |
| 6,130,901 A | * | 10/2000 | Takamine et al. ............ | 372/32 |
| 6,154,474 A | * | 11/2000 | Yoshida ................... | 372/38.02 |
| 6,185,233 B1 | * | 2/2001 | Moothart et al. ............. | 372/32 |
| 6,198,757 B1 | * | 3/2001 | Broutin et al. ................ | 372/32 |
| 6,212,210 B1 | * | 4/2001 | Serizawa ...................... | 372/32 |
| 6,229,832 B1 | * | 5/2001 | Baba et al. ............... | 372/38.01 |
| 6,243,403 B1 | * | 6/2001 | Broutin et al. ................ | 372/32 |
| 6,243,404 B1 | * | 6/2001 | Joyce ........................... | 372/34 |
| 6,272,157 B1 | * | 8/2001 | Broutin et al. ................ | 372/32 |
| 6,327,277 B1 | * | 12/2001 | Killian ........................... | 372/6 |
| 6,353,623 B1 | * | 3/2002 | Munks et al. ................. | 372/20 |
| 6,389,046 B1 | * | 5/2002 | Stayt et al. ............... | 372/29.02 |
| 6,400,737 B1 | * | 6/2002 | Broutin et al. ................ | 372/20 |
| 6,477,190 B1 | * | 11/2002 | Komiyama et al. ........... | 372/34 |
| 6,501,774 B2 | * | 12/2002 | Kuwahara et al. ............ | 372/32 |
| 6,516,010 B1 | * | 2/2003 | Broutin et al. ........... | 372/29.01 |
| 6,556,328 B1 | * | 4/2003 | Tanaka ....................... | 398/192 |
| 6,584,127 B2 | * | 6/2003 | Matsumoto .................. | 372/34 |

* cited by examiner

*Primary Examiner*—Minsun Oh Harvey
*Assistant Examiner*—Tuan N. Nguyen
(74) *Attorney, Agent, or Firm*—Westerman, Hattori, Daniels & Adrian, LLP

(57) ABSTRACT

In the semiconductor laser module testing device, a temperature control power source changes a temperature of a wavelength locker module, and a wavelength monitoring bias circuit detects an output of a wavelength monitor in the changed temperature range and computes a correlation between a temperature of a semiconductor laser and a wavelength of light output therefrom. Moreover, the wavelength of the output light is locked by controlling the temperature of the wavelength locker module while feeding back the output of the wavelength monitor by a wavelength feedback circuit based on the obtained correlation between the temperature and the wavelength.

10 Claims, 4 Drawing Sheets

DEVICE FOR AND METHOD OF TESTING SEMICONDUCTOR LASER MODULE

FIELD OF THE INVENTION

The present invention relates to a device for and method of testing semiconductor laser module.

BACKGROUND OF THE INVENTION

Recently, a higher-speed and larger-capacity communication art has been desired in accordance with widespread use of the Internet and the like, and therefore attention is paid to an optical communication art. FIG. 1 shows a configuration of a conventional testing device of a semiconductor laser module used as a key device in the optical communication art.

The testing device 1 is constituted by a measuring jig 11 which mounts a semiconductor laser module 2, an I-L measuring unit 12 which drives the semiconductor laser module 2 and obtains and computes an electricity-light characteristic, and a computer 13 which designates the setting to a constituted measuring system, operations, and data transfer and controls a series of measurement flows. The testing device is also constituted by an optical power detecting photodiode 14 which detects optical power of light output from the semiconductor laser module 2, a wavelength measuring instrument 15 which counts the number of wavelengths of the light output from the semiconductor laser module 2, and a temperature controller 16 which controls the temperature in the semiconductor laser module 2. A Peltier device is generally set in the semiconductor laser module 2 as a temperature control device and a thermistor (temperature sensor) is set therein as a temperature monitor. The temperature controller 16 controls the current to be supplied to the Peltier device and detects the temperature of a semiconductor laser by the thermistor.

In general, a test about a semiconductor laser is performed by setting a temperature to a constant temperature (e.g. 25° C.) or a wavelength to a specific wavelength. The following is a procedure for a test of setting (tuning) a wavelength to a specific wavelength and measuring an optical output at the wavelength. First, the semiconductor laser module 2 is set to the measuring jig 11. Moreover, an optical fiber 21 extending from the module 2 is connected to an optical fiber 17 connected to the optical power detecting photodiode 14 and wavelength measuring instrument 15 via a connector (not shown). Then, a measuring program is started by the computer 13 to start a series of measurements.

When measurement is started, the inside of the semiconductor laser module 2 is set to a predetermined temperature such as 25° C. by the temperature controller 16. This temperature is temporarily set to start measurement. Then, a predetermined current is supplied from the I-L measuring unit 12 to the semiconductor laser module 2 and a semiconductor laser is driven. At this point of time, a wavelength is confirmed on the basis of the light output from the semiconductor laser module 2 introduced to a wavelength measuring instrument 15.

A wavelength measured by the wavelength measuring instrument 15 is compared with a wavelength as a target (hereafter referred to as target wavelength). The temperature in the semiconductor laser module 2 is controlled by the temperature controller 16 on the basis of the comparison result, and the setting (tuning) to the target wavelength is performed. These operations are repeated until a measured wavelength coincides with the target wavelength. When a measured wavelength reaches the target wavelength, temperature information is read. At the same time, the optical output of the semiconductor laser module 2 is also read. These read values are stored in the computer 13 as measured data. The above explanation includes explanation about a flow of a program with regard to operation after a measuring program is started.

Recently, attention is paid to a wavelength locker module which is able to extremely accurately fix the wavelength of output light as compared with the case of a conventional semiconductor laser module. The wavelength locker module is provided with a wavelength monitor which outputs the wavelength of the light output from a semiconductor laser by converting the wavelength into an intensity. The wavelength monitor is constituted by a wavelength-light intensity converter such as a Fabry-Perot etalon and a light receiving device such as a photodiode. The Fabry-Perot etalon has a characteristic of transmitting the light having a specific wavelength and a characteristic that quantities of transmitted light are changed when wavelengths of the transmitted light are changed.

Therefore, by guiding the light output from a semiconductor laser to a Fabry-Perot etalon and photoelectrically converting the transmitted light by a photodiode, the wavelength of the light output from the semiconductor laser is converted into the intensity of a photoelectric current. The wavelength of the output light is kept constant by feeding back the intensity of the photoelectric current to temperature control of the semiconductor laser and controlling the temperature of the semiconductor laser so that the wavelength of the output light becomes constant at a target wavelength.

To fix an output wavelength of the wavelength locker module to a target wavelength, it is important to use the temperature information of a semiconductor laser when the output wavelength is fixed to the target wavelength and the output values (this is referred to as locking point) of a wavelength monitor. Therefore, it is necessary to apply a test for finding the locking point to the wavelength locker module. Moreover, it is necessary to perform various static characteristic tests and dynamic characteristic tests including a transmission test as an optical semiconductor in a state fixed at a locking point, that is, a state in which the semiconductor laser is operated by feeding back an output of the wavelength monitor to temperature control of the semiconductor laser.

However, conventionally, there is no means to control the temperature of a semiconductor laser on the basis of an output of a wavelength monitor when testing a wavelength locker module. Therefore, there is a problem that it is difficult to quickly and properly perform a test for finding a locking point and various characteristic tests in a state fixed at the locking point.

SUMMARY OF THE INVENTION

It is an object of this invention to provide a device for and method of testing a semiconductor laser module for applying tests of various characteristics as an optical semiconductor to modules as follows while fixing a wavelength. More specifically, one of the modules is a wavelength locker module having a function for locking a wavelength by feeding back the wavelength of the output light detected by a wavelength monitor and controlling a temperature of the module, and another module is a wavelength variable laser module using the wavelength locking function.

In the semiconductor laser module testing device according to one aspect of this invention, the semiconductor laser module is provided with a semiconductor laser, a wavelength monitor for detecting a wavelength of light output from the semiconductor laser, and a temperature control device for controlling a temperature of the semiconductor laser. The semiconductor laser module testing device comprises a wavelength feedback circuit which compares a wavelength detected by the wavelength monitor of the semiconductor laser module with a target wavelength, and outputs a comparison signal corresponding to a result of the comparison. The testing device also comprises a processor which outputs a control signal corresponding to the comparison signal supplied from the wavelength feedback circuit, and a temperature control power source which controls power to be supplied to the temperature control device based on the control signal supplied from the processor.

In the semiconductor laser module testing device according to another aspect of this invention, the semiconductor laser module is provided with a semiconductor laser, a wavelength monitor for detecting a wavelength of light output from the semiconductor laser, a temperature control device for controlling a temperature of the semiconductor laser, and a temperature monitor for detecting a temperature of the semiconductor laser. The semiconductor laser module testing device comprises a wavelength feedback circuit which compares a wavelength detected by the wavelength monitor of the semiconductor laser module with a target wavelength, and outputs a comparison signal corresponding to a result of the comparison. The testing device also comprises a temperature feedback circuit which compares the temperature detected by the temperature monitor with a set temperature, and outputs a comparison signal corresponding to a result of the comparison. The testing device further comprises a processor which outputs a control signal corresponding to the comparison signal supplied from the wavelength feedback circuit or the temperature feedback circuit, and a temperature control power source which controls power to be supplied to the temperature control device based on the control signal supplied from the processor.

In the method of testing a semiconductor laser module according to still another aspect of this invention, the semiconductor laser module provided with a semiconductor laser, a wavelength monitor for detecting a wavelength of light output from the semiconductor laser, and a temperature control device for controlling a temperature of the semiconductor laser. The method of testing the semiconductor laser module comprises a step of obtaining a correlation between a temperature of the semiconductor laser and a wavelength of the light output therefrom based on a change amount of the temperature when the temperature of the semiconductor laser is changed by controlling power to be supplied to the temperature control device, and on a change amount of the wavelength detected by the wavelength monitor.

In the method of testing a semiconductor laser module according to still another aspect of this invention, the semiconductor laser module provided with a semiconductor laser, a wavelength monitor for detecting a wavelength of light output from the semiconductor laser, a temperature control device for controlling a temperature of the semiconductor laser, and a temperature monitor for detecting a temperature of the semiconductor laser. The method of testing the semiconductor laser module comprises a step of obtaining a correlation between a temperature of the semiconductor laser and a wavelength of the light output therefrom based on a change amount of the temperature when the temperature of the semiconductor laser is changed by controlling power to be supplied to the temperature control device while detecting the temperature of the semiconductor laser by the temperature monitor, and on a change amount of the wavelength detected by the wavelength monitor.

Other objects and features of this invention will become apparent from the following description with reference to the accompanying drawings.

DETAILED DESCRIPTION

The present invention relates to a device for and method of testing a semiconductor laser module used to apply tests of various static characteristics as an optical semiconductor and dynamic characteristic tests including a transmission test, to modules as follows. That is, one of the modules is a wavelength locker module which is provided with a wavelength monitor for detecting a wavelength of light output from a semiconductor laser, and which has a function for locking (fixing) the wavelength by feeding back the output of the wavelength monitor to the temperature control of the semiconductor laser. Another module is a wavelength variable laser module using the function for locking a wavelength.

Figure 1:
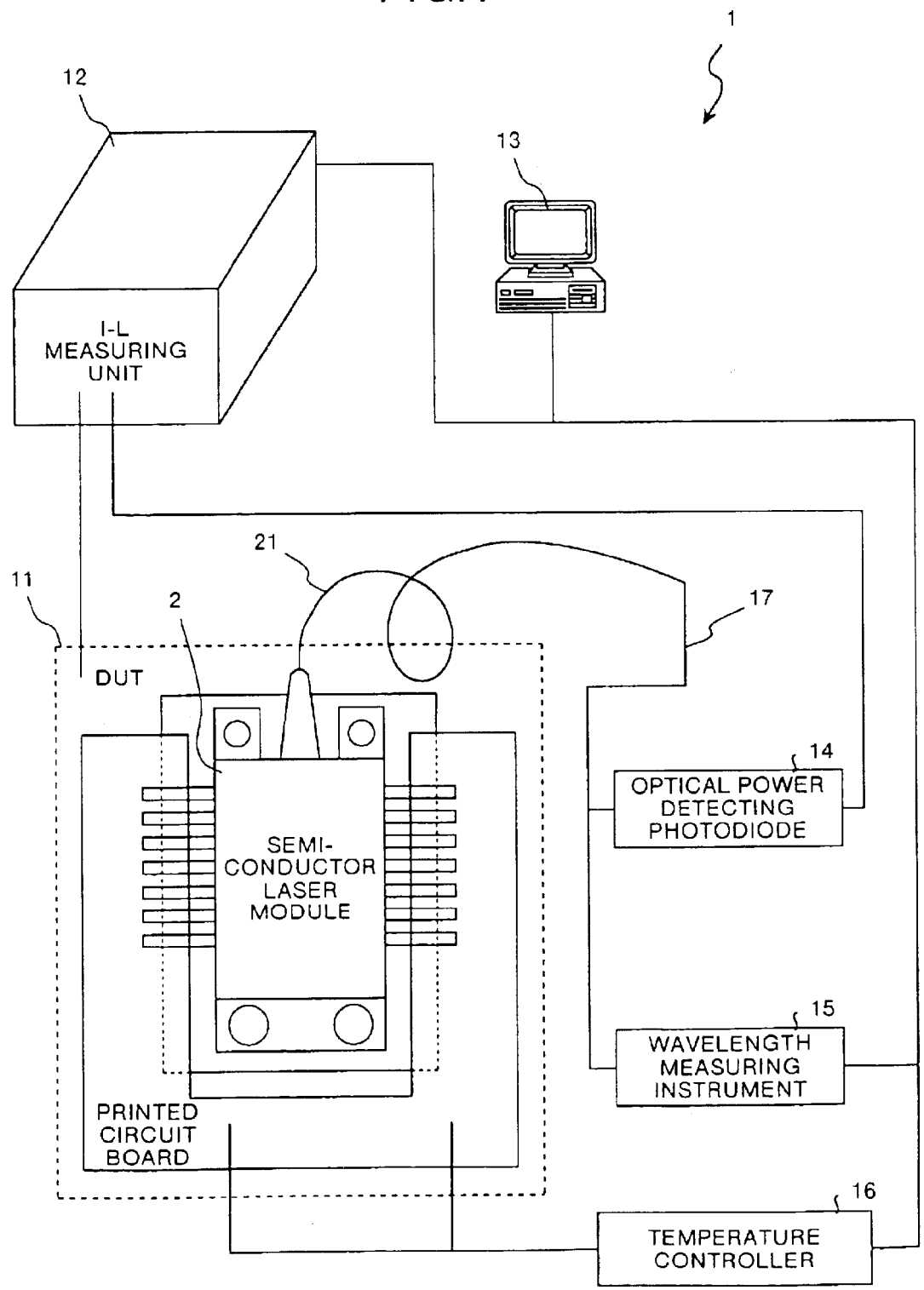
FIG. 1 is a block diagram which shows a configuration of the conventional semiconductor laser module testing device.
Figure 2:
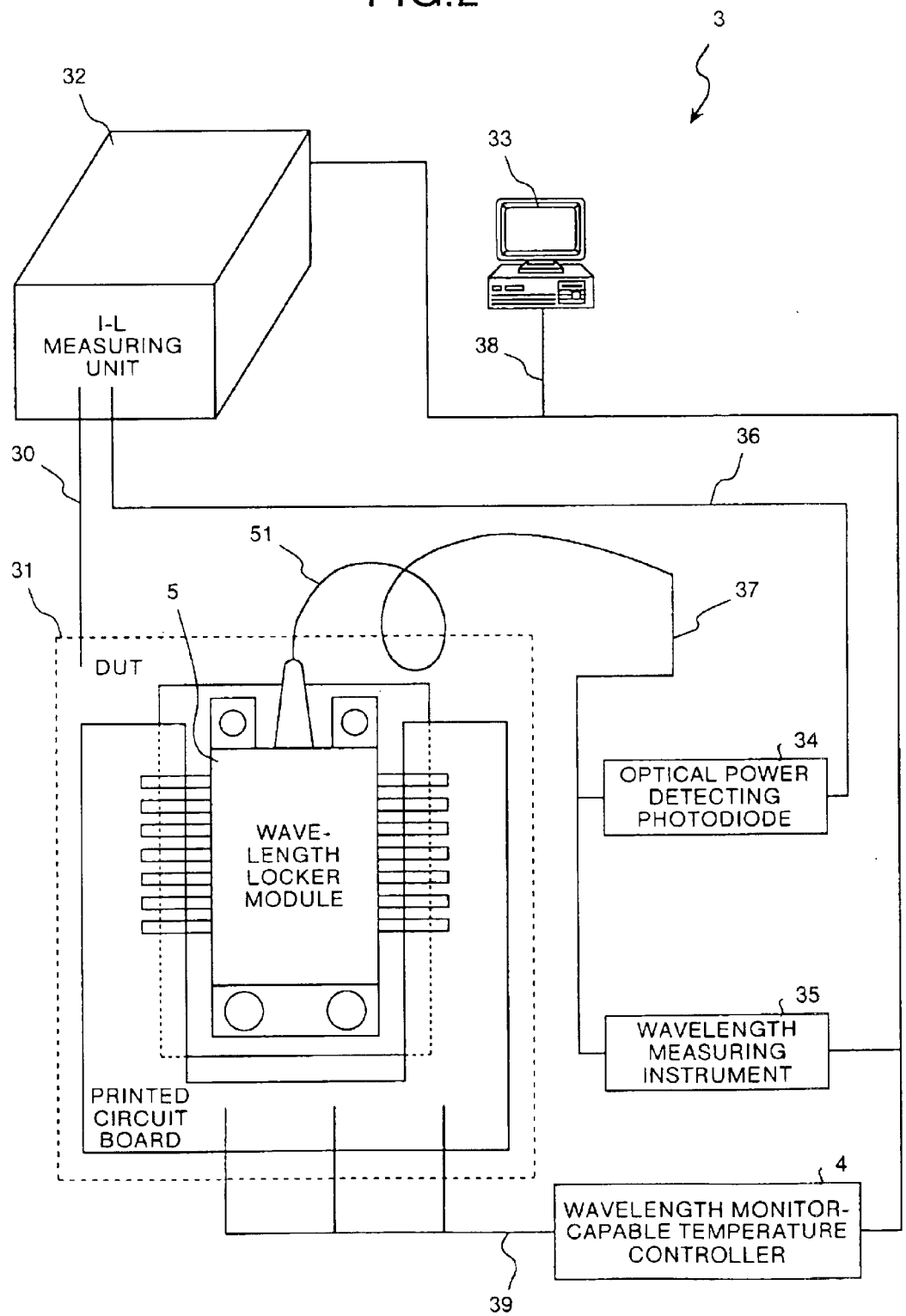
FIG. 2 is a block diagram which shows a configuration of a semiconductor laser module testing device of the present invention.

An embodiment of the present invention is explained in detail below by referring to the accompanying drawings. FIG. 2 is a block diagram which shows a configuration of the semiconductor laser module testing device of the present invention. The semiconductor laser module testing device 3 is constituted by a measuring jig 31, an I-L measuring unit 32, a computer 33, an optical power detecting photodiode 34, a wavelength measuring instrument 35, and a semiconductor laser temperature controller provided with a wavelength monitoring function (hereafter referred to as wavelength monitor-capable temperature controller) 4.

Though a wavelength locker module 5 to be tested by using the semiconductor laser module testing device 3 is not shown, it is provided with a semiconductor laser, a wavelength monitor which detects the wavelength of light output from the semiconductor laser, a temperature control device which controls the temperature of the semiconductor laser, and a temperature monitor which detects the temperature of the semiconductor laser. The wavelength monitor is constituted by a Fabry-Perot etalon and a photodiode. The temperature control device is constituted by a Peltier device and the like. The temperature monitor is constituted by a temperature sensor such as a thermistor.

The measuring jig 31 is a jig which mounts the wavelength locker module 5. The measuring jig 31 is constituted by a printed circuit board having a configuration capable of securing an electrical contact with the wavelength locker module 5 for driving, and securing a thermal contact with the module 5 for radiation. The I-L measuring unit 32 is a test unit which obtains and computes the static characteristic of a semiconductor laser (electricity-light characteristic test). The I-L measuring unit 32 supplies a driving current to the semiconductor laser via a wiring 30 and converts and computes the current supplied from the optical power detecting photodiode 34 as an optical power synchronously with the driving current. The computer 33 is connected to the I-L measuring unit 32, optical power detecting photodiode 34, and wavelength measuring instrument 35 via a GPIB data line 38 to designate the setting to the respective components, operations, and data transfer and to control a flow of a series of measurements.

The optical power detecting photodiode 34 receives the output light of a semiconductor laser and converts the optical output light of a semiconductor laser and converts the optical output power into a current signal. The current signal is supplied to the I-L measuring unit 32 via a wiring 36 and detected by the unit 32. The wavelength measuring instrument 35 counts the number of wavelengths of optical outputs of the semiconductor laser. An optical fiber 37 for connecting an optical fiber 51 extending from the wavelength locker module 5 via a connector (not shown) is connected to the optical power detecting photodiode 34 and wavelength measuring instrument 35. The wavelength monitor-capable temperature controller 4 is connected to the input terminal of the temperature control device of the wavelength locker module 5, the output terminal of the temperature monitor (temperature sensor), and the output terminal of the wavelength monitor to control the temperature and the wavelength of the wavelength locker module 5 according to a designation of the computer 33.

Figure 3:
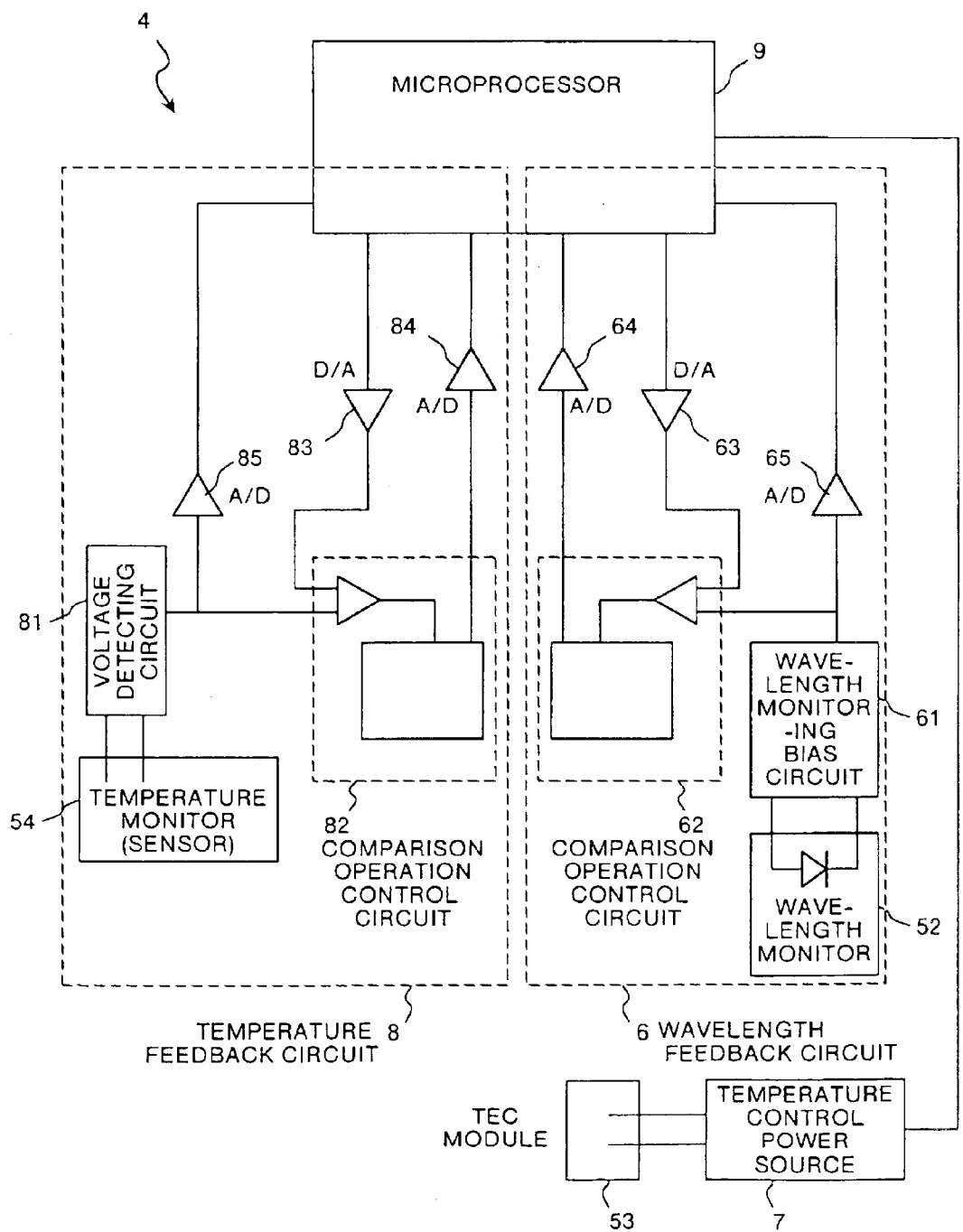
FIG. 3 is a block diagram which shows a configuration of a main part of a wavelength monitor-capable temperature controller for a semiconductor laser module testing device of the present invention.

FIG. 3 is a block diagram which shows a configuration of a main part of the wavelength monitor-capable temperature controller 4. The wavelength monitor-capable temperature controller 4 is provided with a wavelength feedback circuit 6, a temperature control power source 7, and a temperature feedback circuit 8. In FIG. 3, reference numerals 52, 53, and 54 denote a wavelength monitor, a temperature control device, and a temperature monitor of the wavelength locker module 5, respectively. Reference numeral 9 denotes a microprocessor that controls various sections.

The wavelength feedback circuit 6 is provided with a wavelength monitoring bias circuit 61 and a comparison operation control circuit 62. The wavelength monitoring bias circuit 61 monitors a circulating current through photoelectric conversion while supplying a constant bias voltage to the photodiode of the wavelength monitor 52. The comparison operation control circuit 62 compares the current monitored by the wavelength monitoring bias circuit 61 with the current corresponding to a target wavelength. The current corresponding to the target wavelength is supplied by converting a digital signal output from the microprocessor 9 into an analog signal by a digital-to-analog converter 63.

A comparison result by the comparison operation control circuit 62 is converted into a digital signal by an analog-to-digital converter 64 and supplied to the microprocessor 9. Moreover, the current monitored by the wavelength monitoring bias circuit 61 is converted into a digital signal by an analog-to-digital converter 65 and supplied to the microprocessor 9. The temperature control power source 7 increases or decreases the amount of the current to be supplied to the temperature control device 53 in accordance with a control signal supplied from the microprocessor 9.

The temperature feedback circuit 8 is provided with a voltage detecting circuit 81 and a comparison operation control circuit 82. The voltage detecting circuit 81 detects a voltage generated while supplying a constant current to the temperature monitor 54. The comparison operation control circuit 82 compares the voltage detected by the voltage detecting circuit 81 with the voltage corresponding to a set temperature. The voltage corresponding to the set temperature is supplied by converting a digital signal output from the microprocessor 9 into an analog signal by the digital-to-analog converter 83. A comparison result by the comparison operation control circuit 82 is converted into a digital signal by the analog-to-digital converter 84 and supplied to the microprocessor 9. Moreover, the voltage monitored by the voltage detecting circuit 81 is converted into a digital signal by the analog-to-digital converter 85 and supplied to the microprocessor 9.

A flow of the processing when applying a locking point retrieval test to a wavelength locker module by using a testing device having the above configuration is explained below. In the case of wavelength-light intensity conversion using an etalon or the like, a cyclic intensity is changed with respect to fluctuation in the constant direction of incoming optical wavelengths. It is necessary to set a plurality of target wavelengths for the cyclic change and to read the value of each target wavelength of a wavelength monitor.

The wavelength locker module 5 is set to the measuring jig 31. Then, the optical fiber 51 extending from the wavelength locker module 5 is connected to the optical fiber 37 connected to the optical power detecting photodiode 34 and wavelength measuring instrument 35 via a connector (not shown). Then, a series of measurements is started by starting a measuring program by the computer 33. When measurement is started, retrieval is executed by a locking point retrieving method generally known. Temperature information at a target wavelength, a wavelength monitoring current, and an optical output of the wavelength locker module 5 are then read. When there are a plurality of locking wavelengths, temperature information, wavelength monitoring current, and optical output of the wavelength locker module 5 are read from each of the wavelengths.

A gradient of a wavelength (wavelength gradient) to the temperature at each locking point and an extinction ratio explained below are also computed. The extinction ratio is obtained from the maximum or minimum amount of a cyclic intensity change of a wavelength monitor to a constant directional change of an incoming optical wavelength. These read values and computed values are stored in the computer 33 as measured data.

Figure 4:
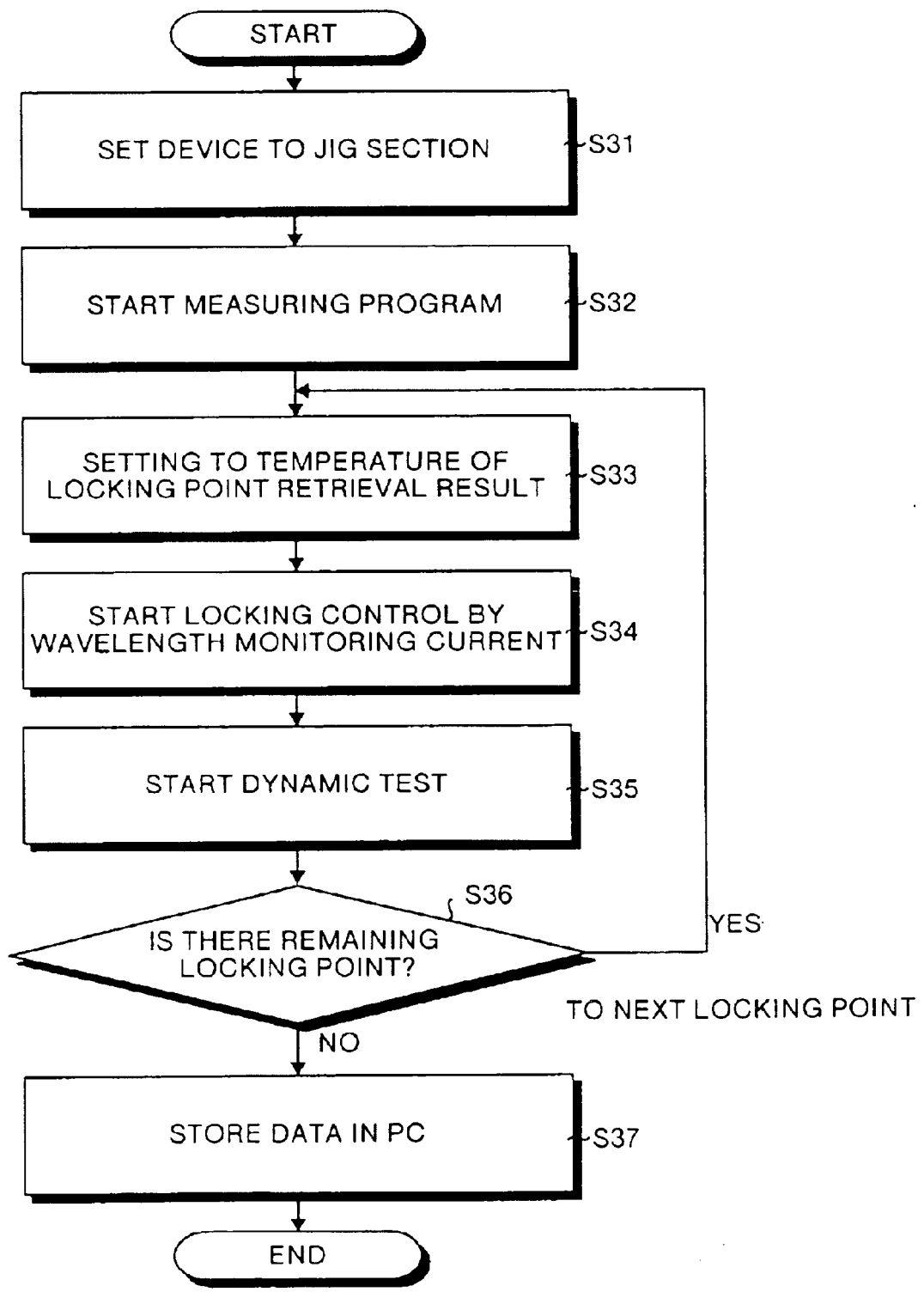
FIG. 4 is a flowchart which shows a flow of the processing of a wavelength locking test using the semiconductor laser module testing device of the present invention.

A flow of the processing when applying a wavelength locking test to a wavelength locker module by using a testing device having the above configuration is explained below. FIG. 4 is a flowchart which show a flow of the processing of the wavelength locking test. First, the wavelength locker module 5 is set to the measuring jig 31. Moreover, the optical fiber 51 extending from the wavelength locker module 5 is connected to the optical fiber 37 connected to the optical power detecting photodiode 34 and wavelength measuring instrument 35 through a connector (not shown) (step S31). Then, a measuring program is started by the computer 33 to start a series of measurements (step S32).

When measurement is started, a temperature inside the wavelength locker module 5 is set to a predetermined temperature by the wavelength monitor-capable temperature controller 4 (step S33). The predetermined temperature here denotes a temperature based on the temperature information measured and obtained at the same time as a wavelength monitoring current at each locking point in a locking point retrieving test. The operation in the step S33 is executed in order to roughly set the temperature before staring locking by a wavelength monitoring current because when wavelength monitoring currents are recursively changed, the same monitoring current may be taken.

A gradient necessary for feedback to temperature control by a wavelength monitor is computed. This is performed by the operations as follows. The microprocessor 9 controls the temperature feedback circuit 8 and the temperature control power source 7 to change temperature. At the same time, the wavelength monitoring bias circuit 61 records outputs of the wavelength monitor and computes a change amount of the outputs of the wavelength monitor with respect to a temperature change. The obtained gradient is stored in the wavelength monitor-capable temperature controller 4 as a quantitative constant. This stored value is continuously stored every measuring device or in a memory such as a RAM.

A predetermined current is supplied from the I-L measuring unit 32 to the wavelength locker module 5 and thereby, a semiconductor laser is driven. When the current is supplied to the semiconductor laser, a temperature becomes constant but a wavelength is shifted. In this state, the wavelength monitor-capable temperature controller 4 starts controlling so that the wavelength monitoring current has a specified current amount (step S34). According to the above operation, the state of a wavelength locking point retrieved in the locking point retrieving test is reproduced and it is possible to keep the wavelength monitoring current constant. Thus, the wavelength of the semiconductor laser is accurately controlled to a constant wavelength. In this state, an I-L test and a characteristic test (dynamic test) including a transmission test are performed (step S35).

When there are a plurality of locking wavelengths (step S36), the state of a wavelength locking point is reproduced for each locking wavelength, and an I-L test and characteristic tests including a transmission test are performed at a constant wavelength. Obtained test results are stored in the computer 33 as measured data (step S37) and the tests are completed. The explanation about a flow of a program is included in the above explanation with regard to explanation after a measuring program is started.

According to the above-mentioned embodiment, the correlation between the temperature of the semiconductor laser in the wavelength locker module 5 and the wavelength of the output light is obtained, and it is therefore possible to obtain a feedback amount for locking a wavelength. Moreover, it is possible to lock wavelengths when various characteristics are tested on the basis of the correlation. Therefore, it is possible to quickly and properly apply various characteristic tests as an optical semiconductor to the wavelength locker module 5 while locking wavelengths.

Therefore, the present invention allows various modifications. For example, as shown in FIG. 3, it is allowed to use a configuration of sharing a digital-to-analog converter, an analog-to-digital converter, and a comparison operation control circuit constituting the wavelength feedback circuit 6 and temperature feedback circuit 8 with the circuits 6 and 8 and using the converters and the control circuit by changing them with a switch instead of independently constituting the wavelength feed back circuit 6 and the temperature feedback circuit 8 via the microprocessor 9 as shown in FIG. 3.

It is possible to use the present invention when applying a test not only to a wavelength locker module but also to a wavelength variable laser module using a wavelength locking function. Furthermore, it is possible to use the present invention when performing a test by keeping the temperature of a semiconductor laser constant.

According to the present invention, the correlation between the temperature of a semiconductor laser in the wavelength locker module and the wavelength of output light can be obtained, and therefore it is possible to obtain a feedback amount for locking a wavelength. Moreover, it is possible to lock a wavelength on various characteristic tests based on the correlation. Therefore, it is possible to quickly and properly apply various characteristic tests as an optical semiconductor to a wavelength locker module and a wavelength variable laser module using a wavelength locking function while locking a wavelength.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A device for testing a semiconductor laser module, the semiconductor laser module including a semiconductor laser, a wavelength monitor for detecting a wavelength of light output from the semiconductor laser, and a temperature control element for controlling a temperature of the semiconductor laser, the device comprising:

a wavelength feedback circuit which compares a wavelength detected by the wavelength monitor with a target wavelength at which the semiconductor laser module is to be tested, and outputs a comparison signal corresponding to a result of the comparison;

a processor which outputs a control signal corresponding to the comparison signal supplied from the wavelength feedback circuit;

a temperature control power source which controls power to be supplied to the temperature control element based on the control signal supplied from the processor;

a memory unit; and a wavelength measuring unit, connected to the semiconductor laser module, measuring a wavelength output from the semiconductor laser module when the semiconductor laser module is tested, wherein the processor obtains a correlation between the temperature of the semiconductor laser and the wavelength of the light output from the semiconductor laser based on a change in the temperature and on a change in the wavelength detected by the wavelength monitor, the changes being generated when changing the temperature of the semiconductor laser by controlling the power of the temperature control power source to be supplied to the temperature control element, and the processor stores the correlation into the memory unit.

2. The device according to claim 1, wherein the processor controls the power of the temperature control power source to be supplied to the temperature control element based on the comparison signal supplied from the wavelength feedback circuit and the correlation stored in the memory unit so that the wavelength of the light output from the semiconductor laser coincides with the target wavelength.

3. A device for testing a semiconductor laser module, the semiconductor laser module including a semiconductor laser, a wavelength monitor for detecting a wavelength of light output from the semiconductor laser, a temperature control element for controlling a temperature of the semiconductor laser, and a temperature monitor for detecting a temperature of the semiconductor laser, the device comprising:

a wavelength feedback circuit which compares a wavelength detected by the wavelength monitor with a target wavelength at which the semiconductor laser module is to be tested, and outputs a comparison signal corresponding to a result of the comparison;

a temperature feedback circuit which compares the temperature detected by the temperature monitor with a set temperature at which the semiconductor laser module is to be tested, and outputs a comparison signal corresponding to a result of the comparison;

a processor which outputs a control signal corresponding to the comparison signal supplied from the wavelength feedback circuit or the temperature feedback circuit;

a temperature control power source which controls power to be supplied to the temperature control element based on the control signal supplied from the processor;

a memory unit; and a wavelength measuring unit, connected to the semiconductor laser module, measuring a wavelength of light output from the semiconductor laser module when the semiconductor laser module is tested;

wherein the processor obtains a correlation between the temperature of the semiconductor laser and the wavelength of the light output from the semiconductor laser based on a change in the temperature and on a change in the wavelength detected by the wavelength monitor, the changes being generated when changing the temperature of the semiconductor laser by controlling the power of the temperature control power source to be supplied to the temperature control element, and the processor stores the correlation into the memory unit.

4. The device according to claim 3, wherein the processor controls the power of the temperature control power source to be supplied to the temperature control element based on the comparison signal supplied from the temperature feedback circuit and the correlation stored in the memory unit so that the temperature of the semiconductor laser coincides with the set temperature.

5. The device according to claim 3, wherein the processor controls the power of the temperature control power source to be supplied to the temperature control element based on the comparison signal supplied from the temperature feedback circle so that the temperature of the semiconductor laser coincides with the set temperature.

6. A method of testing a semiconductor laser module, the semiconductor laser module including a semiconductor laser, a wavelength monitor for detecting a wavelength of light output from the semiconductor laser, and a temperature control element for controlling a temperature of the semiconductor laser, the method comprising the steps of;

controlling power to be supplied to the temperature control element by changing the temperature of the semiconductor laser;

obtaining a correlation between the temperature of the semiconductor laser and the wavelength of the light output from the semiconductor laser based on a change in the temperature and on a change in the wavelength detected by the wavelength monitor, the changes being generated when the temperature of the semiconductor laser is changed in the controlling steps;

storing the correlation into a memory unit; and measuring a wavelength of light output from the semiconductor laser module when the semiconductor laser module is tested.

7. The method according to claim 6, further comprising the steps of:

fixing the wavelength of the light output from the semiconductor laser to a target wavelength at which the semiconductor laser module is to be tested, by controlling the power to be supplied to the temperature control element based on the wavelength detected and fed back by the wavelength monitor and the correlation stored in the memory unit, so that the wavelength of the light output from the semiconductor laser coincides with the target wavelength; and testing the semiconductor laser module at the target wavelength that has been fixed.

8. A method of testing a semiconductor laser module, the semiconductor laser module including a semiconductor laser, a wavelength monitor for detecting a wavelength of light output from the semiconductor laser, a temperature control element for controlling a temperature of the semiconductor laser, and a temperature monitor for detecting a temperature of the semiconductor laser, the method comprising the steps of:

detecting the temperature of the semiconductor laser;

controlling power to be supplied to the temperature control element by changing the temperature of the semiconductor laser;

obtaining a correlation between the temperature of the semiconductor laser and the wavelength of the light output from the semiconductor laser based on a change in the temperature and on a change in the wavelength detected by the wavelength monitor, the changes being generated when the temperature of the semiconductor laser is changed in the controlling step;

storing the correlation into a memory unit; and measuring a wavelength of light output from the semiconductor laser module when the semiconductor laser module is tested.

9. The method according to claim 8, further comprising the steps of:

fixing the wavelength of the light output from the semiconductor laser to a target wavelength at which the semiconductor laser module is to be tested, by controlling the power to be supplied to the temperature control element based on the wavelength detected and fed back by the wavelength monitor and the correlation stored in the memory unit, so that the wavelength of the light output from the semiconductor laser coincides with the target wavelength; and testing the semiconductor laser module at the target wavelength that has been fixed.

10. The method according to claim 8, further comprising the steps of:

keeping the temperature of the semiconductor laser at a set temperature at which the semiconductor laser module is to be tested, by controlling the power to be supplied to the temperature control element based on the temperature detected and fed back by the temperature monitor, so that the temperature of the semiconductor laser coincides with the set temperature; and testing the semiconductor laser module at the set temperature that has been kept.

* * * * *